(12) United States Patent
Li

(10) Patent No.: US 10,431,501 B2
(45) Date of Patent: Oct. 1, 2019

(54) SEMICONDUCTOR DEVICE WITH HIGH-K GATE DIELECTRIC LAYER AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/494,607

(22) Filed: Apr. 24, 2017

(65) Prior Publication Data
US 2018/0012811 A1    Jan. 11, 2018

(30) Foreign Application Priority Data

Jul. 7, 2016    (CN) .......................... 2016 1 0531682

(51) Int. Cl.
*H01L 21/8238*    (2006.01)
*H01L 29/51*    (2006.01)
(Continued)

(52) U.S. Cl.
CPC ................ *H01L 21/823871* (2013.01); *H01L 21/28088* (2013.01); *H01L 21/28176* (2013.01);
(Continued)

(58) Field of Classification Search
CPC ............ H01L 29/517; H01L 29/66545; H01L 21/28185; H01L 21/823857; H01L 21/28088; H01L 21/28176
(Continued)

(56) References Cited

U.S. PATENT DOCUMENTS

2004/0155274 A1* 8/2004 DeBoer ............. H01L 21/32134
257/296
2006/0237803 A1* 10/2006 Zhu ................... H01L 21/28097
257/410

(Continued)

OTHER PUBLICATIONS

The European Patent Office (EPO) The Extended European Search Report for 17179738.4 dated Nov. 10, 2017 13 Pages.

*Primary Examiner* — David Chen
(74) *Attorney, Agent, or Firm* — Anova Law Group, PLLC

(57) ABSTRACT

Semiconductor devices and fabrication methods thereof are provided. An exemplary fabrication method includes forming an interlayer dielectric layer on a base substrate; forming a plurality of first openings and second openings in the interlayer dielectric layer, one first opening connecting to a second opening, the one first opening being between the second opening and the base substrate; forming a high-K gate dielectric layer on side and bottom surfaces of the first openings and on side surfaces of the second openings; forming a cap layer, containing oxygen ions, on the high-K gate dielectric layer; forming an amorphous silicon layer on the cap layer at least on the bottoms of the first openings; performing a thermal annealing process on the amorphous silicon layer, the cap layer and the high-K dielectric; removing the amorphous silicon layer; and forming a metal layer, in the first openings and the second openings.

19 Claims, 5 Drawing Sheets

(51) Int. Cl.
 *H01L 21/28* (2006.01)
 *H01L 21/768* (2006.01)
 *H01L 23/535* (2006.01)
 *H01L 27/092* (2006.01)
 *H01L 29/06* (2006.01)
 *H01L 29/66* (2006.01)

(52) U.S. Cl.
 CPC .. *H01L 21/28185* (2013.01); *H01L 21/76843* (2013.01); *H01L 21/76861* (2013.01); *H01L 21/76883* (2013.01); *H01L 21/823821* (2013.01); *H01L 23/535* (2013.01); *H01L 27/0924* (2013.01); *H01L 29/0653* (2013.01); *H01L 29/517* (2013.01); *H01L 29/66545* (2013.01); *H01L 21/823842* (2013.01); *H01L 21/823857* (2013.01)

(58) Field of Classification Search
 USPC ............... 438/216, 287, 585, 591; 257/368, 257/E21.19, E21.266
 See application file for complete search history.

(56) References Cited

U.S. PATENT DOCUMENTS

| | | | |
|---|---|---|---|
| 2011/0136313 A1* | 6/2011 | Lee | H01L 21/28088 438/299 |
| 2011/0143529 A1* | 6/2011 | Lee | H01L 21/28185 438/591 |
| 2012/0132998 A1 | 5/2012 | Kwon et al. | |
| 2013/0026578 A1 | 1/2013 | Tsau | |
| 2013/0072030 A1* | 3/2013 | Wang | H01L 21/3105 438/785 |
| 2014/0048891 A1* | 2/2014 | Chen | H01L 29/66575 257/410 |
| 2015/0126023 A1* | 5/2015 | Choi | H01L 21/28158 438/591 |
| 2015/0129972 A1 | 5/2015 | Choi | |
| 2016/0027664 A1 | 1/2016 | Ando et al. | |
| 2016/0093711 A1 | 3/2016 | Hong et al. | |
| 2017/0194459 A1* | 7/2017 | Ando | H01L 29/66545 |

* cited by examiner

SEMICONDUCTOR DEVICE WITH HIGH-K GATE DIELECTRIC LAYER AND FABRICATION METHOD THEREOF

CROSS-REFERENCES TO RELATED APPLICATIONS

This application claims the priority of Chinese patent application No. 201610531682.8, filed on Jul. 7, 2016, the entirety of which is incorporated herein by reference.

FIELD OF THE DISCLOSURE

The present disclosure generally relates to the field of semiconductor technologies and, more particularly, relates to semiconductor devices and fabrication methods thereof.

BACKGROUND

The major devices in integrated circuits (ICs), especially very-large-scale-integration (VLSI), include metal-oxide-semiconductor field-effect transistors (MOS transistors). With the continuous developments of the IC manufacturing, technology, the technical node of the semiconductor device technology has become smaller and the smaller; and the geometric dimension of the semiconductor structures has become smaller and smaller by following the Moore's law. When the size of the semiconductor devices is reduced to a certain extent, secondary effects caused by the physical limitations of the semiconductor structures successively emerge. Accordingly, the critical dimension reduction in proportion of the semiconductor structures has become more and more difficult. One of the most challenging issues in the field of semiconductor manufacturing is about the large leakage current problem in the semiconductor structures, which is mainly caused by the continuous reduction of the thickness of the conventional gate dielectric layer.

The current approach to solve such issues is to replace the conventional silicon dioxide gate dielectric material with a high-K dielectric material; and use a metal material as the gate electrode. Such a conventional method may avoid the Femi level pin effect and the boron diffusion effect of the high-K material and the conventional gate material. The inclusion of the high-K metal gate (HKMG) reduces the leakage current of the semiconductor structures.

Although the introduction of the HKMG structures is able to improve the electrical properties of the semiconductor structures to a certain extent, the semiconductor devices formed by the existing methods may need further improvements. The disclosed semiconductor structures and methods are directed to solve one or more problems set forth above and other problems in the art.

BRIEF SUMMARY OF THE DISCLOSURE

One aspect of the present disclosure includes a method for fabricating a semiconductor device. The method includes providing forming an interlayer dielectric layer on a base substrate; forming a plurality of first openings and second openings in the interlayer dielectric layer, one first opening connecting to a second opening, the one first opening being between the second opening and the base substrate to expose the base substrate; forming a high-K gate dielectric layer on side and bottom surfaces of the first openings and on side surfaces of the second openings; forming a cap layer, containing oxygen ions, on the high-K gate dielectric layer; forming an amorphous silicon layer on the cap layer at least on the bottoms of the first openings; performing a thermal annealing process on the amorphous silicon layer, the cap layer and the high-K dielectric layer to cause the oxygen ions to diffuse into the high-K dielectric layer; removing the amorphous silicon layer; and forming a metal layer to fill the first openings and the second openings.

Another aspect of the present disclosure includes a semiconductor device. The semiconductor device includes a base substrate having a PMOS region and an NMOS region; a plurality gate structures formed on the base substrate, the gate structures including an interface layer formed on the base substrate, a high-K gate dielectric layer formed on the interface layer, a cap layer formed on the high-K gate dielectric layer and a metal layer formed over the high-K gate dielectric layer; an interlayer dielectric layer covering side surfaces of the gate structures formed over the base substrate; and source/drain doping regions formed in the base substrate at two sides of the gate structures. The gate structures is formed by forming a plurality of first openings and second openings in the interlayer dielectric layer, one first opening connecting to a second opening, the first opening being between the second opening and the base substrate to expose the base substrate; forming the high-K gate dielectric layer on side and bottom surfaces of the first openings and side surfaces of the second openings; forming an cap layer, containing oxygen ions, on the high-K gate dielectric layer; forming an amorphous silicon layer at least on the bottoms of the first openings; performing a thermal annealing process on the amorphous silicon layer, the cap layer and the high-K dielectric layer to cause the oxygen ions to diffuse into the high-K dielectric layer; removing the amorphous silicon layer; and forming the metal layer over the cap layer to fill up the first openings and the second openings.

Other aspects of the present disclosure can be understood by those skilled in the art in light of the description, the claims, and the drawings of the present disclosure.

DETAILED DESCRIPTION

Figure 1:
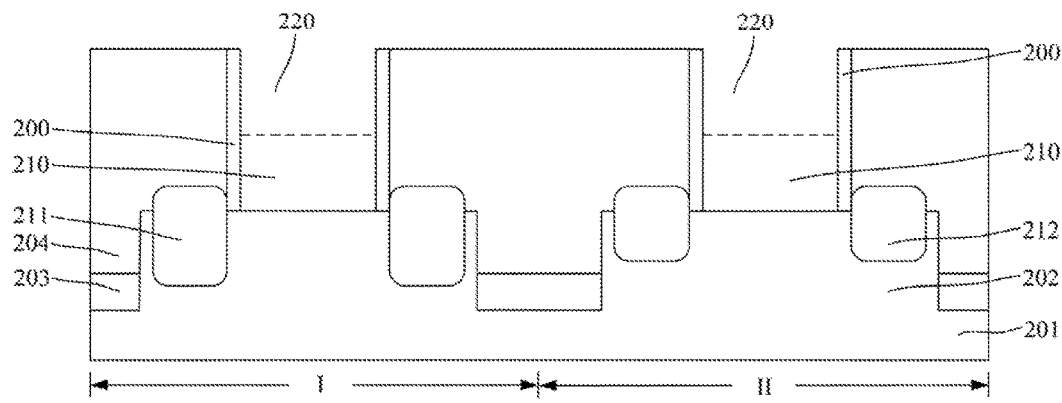
FIGS. 1-11 illustrate semiconductor structures corresponding to certain stages of an exemplary fabrication process of a semiconductor device consistent with the disclosed embodiments.

Reference will now be made in detail to exemplary embodiments of the invention, which are illustrated in the accompanying drawings. Wherever possible, the same reference numbers will be used throughout the drawings to refer to the same or like parts.

When using the high-K dielectric material as the gate dielectric material, the leakage current of semiconductor structures can be reduced. However, the dielectric relaxation current (DR current) of the semiconductor devices is still large. The large DR current may deteriorate the electrical properties of the semiconductor devices. For example, the positive bias temperature instability (PBTI) and the negative bias temperature instability (NBTI) of the semiconductor devices may be noticeable. The large DR current in the semiconductor devices is often caused by the deflects in the high-K dielectric material. The defects generate electron traps in the high-K dielectric material; and cause the DR phenomenon to be noticeable; and cause the high-K dielectric material to have a large loss angle.

The defects in the high-K dielectric material include one or more of oxygen vacancies, dangling bonds, nonbonding ions, etc. If the defects in the high-K dielectric material are reduced, the electrical properties of the semiconductor devices can be significantly improved. Thus, after forming the high-K gate dielectric layer, a cap layer is formed on the high-K gate dielectric layer. Then, a thermal annealing process is performed on the cap layer and the high-K gate dielectric layer. The thermal annealing process is able to cause oxygen ions in the cap layer to diffuse into the high-K gate dielectric layer. The oxygen ions occupy the oxygen vacancies; and the number of the oxygen vacancies in the high-K gate dielectric layer may be reduced.

However, it is difficult to control the amount of the oxygen ions diffusing into the high-K gate dielectric layer. If the amount of oxygen ions diffusing into the high-K gate dielectric layer is too large, the oxygen ions are able to further oxidize the surface of the substrate. Thus, the thickness of the interface layer between the high-K gate dielectric layer and the substrate is increased.

Further, for the fin field-effect transistor (FinFET) structure, because the side surfaces of the fins are the (110) crystal face. Comparing with the (100) crystal face, the (110) crystal face on the side surfaces of the fins has more dangling bonds. Thus, the side surfaces of the fins are easier to absorb the oxygen ions; and the thickness increasing issue of the interface layer may be more obvious.

Thus, before forming the cap layer, an amorphous silicon layer is formed on the cap layer. The amorphous silicon layer may have more dangling bonds. Therefore, the amorphous silicon layer may be able to absorb at least a portion of the oxygen ions during the thermal annealing process to reduce the amount of the oxygen ions diffusing into the high-K gate dielectric layer. The over-oxidizing issue of the substrate may be avoided.

However, the amorphous silicon layer may cause other issues during the thermal annealing process. The performance of the semiconductor devices may be still unacceptable. The amorphous silicon layer is formed on the cap layer alter forming the high-K gate dielectric layer in the openings in the interlayer dielectric layer and forming the cap layer. Thus, the contact area between the amorphous silicon layer and the cap layer may be relatively large. During the thermal annealing process, because the crystal lattice difference between the cap layer and the amorphous silicon layer is increased, a stress is generated between the cap layer and the amorphous silicon layer. Further, because the contact area between the cap layer and the amorphous silicon layer is relatively large, the stress applied on the cap layer caused by the tea amorphous silicon layer may be too large. The stress may also be transferred into the high-K gate dielectric layer; and may generate cracks in the high-K gate dielectric layer and the cap layer. Thus, the performance of the semiconductor device may be reduced.

The present disclosure provides a semiconductor device and a fabrication method thereof. The fabrication method includes providing a base substrate and an interlayer dielectric layer on the base substrate. First openings and second openings connecting each other may be formed in the interlayer dielectric layer. The first openings may be formed between the base substrate and the second openings; and the first openings may expose the surface of the base substrate. Further, the method may include forming a high-K gate dielectric layer on the bottom and side surfaces of the first openings and the side surfaces of the second openings. The high-K gate dielectric layer may have defects. Further, the method may also include forming a cap layer having oxygen ions on the interlayer dielectric layer; and forming an amorphous silicon layer exposing the cap layer on the side surfaces of the second openings on the cap layer on the bottoms of the first openings. Further, the method may also include performing a thermal annealing process to the amorphous silicon layer, the cap layer and the high-K gate dielectric layer. The thermal annealing process may cause the oxygen ions in the cap layer to diffuse into the high-K gate dielectric layer; and cause the amorphous silicon layer to absorb the oxygen ions in the cap layer. Further, the method may also include removing the amorphous silicon layer; and forming a metal layer filling the first opening and the second openings on the cap layer.

By using present disclosed method, the amount of the oxygen vacancies in the high-K gate dielectric layer may be reduced and/or eliminated; and the formation of cracks in the high-K gate dielectric layer and/or the cap layer may be prevented. Further, the over-oxidation of the base substrate at the bottom of the first openings may be avoided. Thus, the electrical in properties of the semiconductor devices may be improved.

Figure 10:
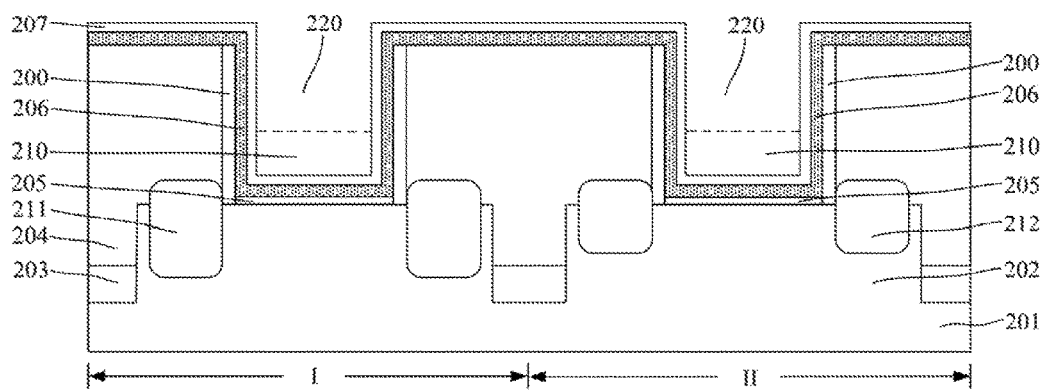
Figure 11:
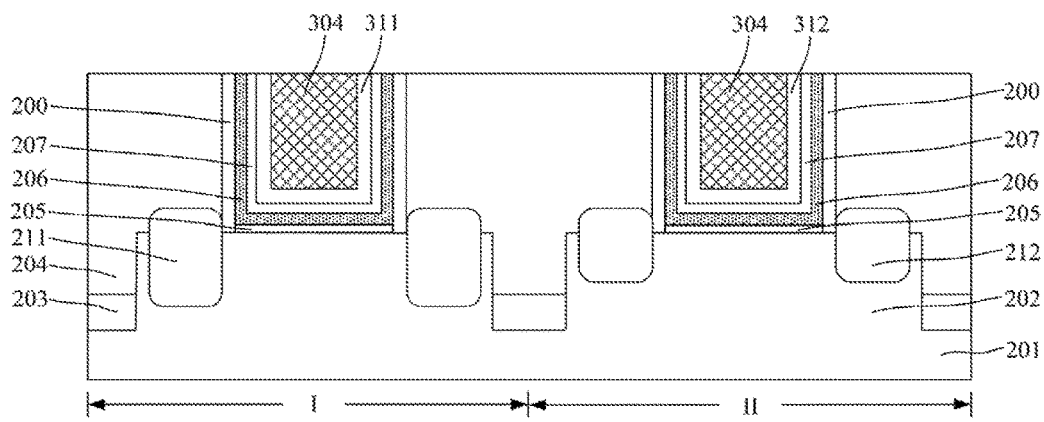
Figure 12:
FIG. 12 illustrates an exemplary fabrication process of a semiconductor device consistent with the disclosed embodiments.

FIG. 12 illustrates an exemplary fabrication process of a semiconductor device consistent with the disclosed embodiments. FIGS. 1-11 illustrate semiconductor structures corresponding to certain stages of the exemplary fabrication process.

As shown in FIG. 12, at the beginning of the fabrication process, a base substrate with certain structures is provided (S101). FIG. 1 illustrates a corresponding semiconductor structure.

As shown in FIG. 1, a base substrate is provided; and an interlayer dielectric layer 204 is formed on the base substrate. First openings 210 and second openings 220 may be formed in the interlayer dielectric layer 204.

Each first opening 210 and a corresponding second opening 220 may interpenetrate. The first opening 210 may be between the second opening 220 and the base substrate. The first openings 210 may expose the surface of the base substrate. For illustrative purposes, the boundary between a first opening 210 and a corresponding second opening 220 is illustrated as the dashed line in FIG. 1.

In one embodiment, the semiconductor device is a CMOS device. The base substrate may include a PMOS region I and an NMOS region II. A first opening 210 and a corresponding second opening 220 may be formed in the interlayer dielectric layer 204 in the first region I. A first opening 210 and a corresponding second opening 220 may be formed in the interlayer dielectric layer 204 in the second region II. In some embodiments, the base substrate may include only a PMOS region, or an NMOS region.

In one embodiment, the semiconductor device is a fin field-effect transistor structure. As shown in FIG. 1, the base substrate may include a semiconductor substrate 201 and fins 202 formed on the semiconductor substrate 201.

The semiconductor substrate 201 may be made of Si, Ge, SiGe, SiC, GaAs, or GaIn, etc. The semiconductor substrate 201 may also be a silicon on insulator (SOI) substrate, or a germanium on insulator (GOI) substrate, etc. The fins 202 may be made of Si Ge, SiGe, SiC, GaAs, or GaIn, etc. In one embodiment, the semiconductor substrate 20 is a Si substrate; and the fins 202 are made of Si.

In one embodiment, the process for forming the semiconductor substrate 201 and the fins 202 may include providing an initial base substrate; forming a patterned hard mask layer (not shown) on the initial base substrate; and etching the initial base substrate using the patterned hard mask layer as an etching mask. The initial base substrate after the etching process may be configured as the semiconductor substrate 201. The protruding portions of the initial base substrate on the surface of the semiconductor substrate 201 may be configured as the fins 202. After the etching process, the patterned hard mask layer may be removed.

Further, as shown in FIG. 1, the base substrate may also include an insulation layer 203 formed in the surface of the semiconductor substrate 201. The insulation layer 203 may cover portions of the side surfaces of the fins 202; and the top surface of they insulation layer 203 may be below the top surfaces of the fins 202. The insulation layer 203 may be used as the insulation structures of the CMOS device.

The insulation layer 203 may be made of any appropriate material(s), such as silicon oxide, silicon nitride, or silicon oxynitride, etc. In one embodiment, the insulation layer 203 is made of silicon oxide.

In some embodiments, the semiconductor device is a planar transistor structure. The base substrate is a planar substrate. The base substrate may be made of Si, Ge, SiGe, SiC, GaAs, GaIn, SOI or GOI, glass, or group III-V compound semiconductor, etc. The group III-V compound semiconductor may include GaN, or GaAs, etc.

Further, referring to FIG. 1, the first openings 210 and the second openings 220 in the PMOS regions I may cross over the fins 202 in the first region I; and the bottoms of the first openings 210 may expose the top and side surfaces of the fins 202 in the PMOS region I. The first openings 210 and the second openings 220 in the PMOS region I may reserve the spatial positions for subsequently funning the first gate structures.

Further, the first openings 210 and the second openings 220 in the NMOS region II may cross over the fins 202 in the second region II; and the bottoms of the first openings 210 may expose the top and side surfaces of the fins 202 in the NMOS region II. The first openings 210 and the second openings 220 in the NMOS region II may reserve the spatial positions for subsequently forming the second gate structures.

In one embodiment, a high-K gate dielectric layer may be subsequently formed on the bottom and side surfaces of the first openings 210; and an amorphous silicon layer may be formed on the high-K gate dielectric layer on the bottom surfaces of the first openings 210. Thus, the depth of the first openings 210 may not be very large. If the depth of the first openings 210 is too large, the contact area between the subsequently formed amorphous silicon layer and the high-K gate dielectric layer may be too large. During a subsequent thermal annealing process, the stress on the high-K gate dielectric layer applied by the amorphous silicon layer may be too large; and the high-K gate dielectric layer may be broken. Thus, the depth of the first openings 210 may be smaller than, or equal to the depth of the second openings 220. Further, the depth of the first openings 210 may be greater than, or equal to a sum of the thickness of the high-K gate dielectric layer subsequently formed on the bottom of be first openings 210 and the thickness of the subsequently formed cap layer and the thickness of the subsequently formed amorphous silicon layer.

Further, as shown in FIG. 1, first source/drain doping regions 211 may be formed in the fins 202 at two sides of the first openings 210 in the PMOS regions I. Second source/drain doping region 212 may be formed in the fins 202 at two sides of the first openings 210 in the MOOS region II.

The doping ions in the first source/drain doping regions 211 may be different from the doping ions in the second source/drain doping regions 212. In one embodiment, the doping ions in the first source/drain doping regions 211 are P-type ions, such as B ions, Ga ions or In ions, etc. The doping ions in the second source/drain doping regions 212 may be N-type ions, such as P ions, As ions, or Sb ions, etc.

The process for thrilling the interlayer dielectric layer 204, the first openings 210 and the second openings 220 may include forming first dummy gate structures on portions of the surface of the base substrate in the PMOS regions I and second dummy gate structures on portions of the base substrate in the NMOS region II; forming the first source/drain doping regions 211 in the base substrate in the PMOS region I at two sides of the first dummy gate structures; and forming the second source/drain doping regions 212 in the base substrate in the NMOS region H at two sides of the second dummy gate structures; forming the interlayer dielectric layer 204 over the base substrate to cover the side surfaces of the first dummy gate structures and the second dummy gate structures; removing the first dummy gate structures to form the first openings 210 and the second openings 220 in the PMOS region I; and removing the second dummy gate structures to form the first openings 210 and the second openings 220 in the NMOS region II.

In one embodiment, as shown in FIG. 1, sidewall spacers 200 may be formed on the sidewall surfaces of the first dummy gate structures and the second dummy gate structures. After removing the first dummy gate structures and the second dummy gate structures, the sidewall spacers 200 may be kept.

The sidewall spacers 200 may be made of any appropriate material(s). In one embodiment the sidewall spacers 200 are made of silicon oxide.

Figure 2:
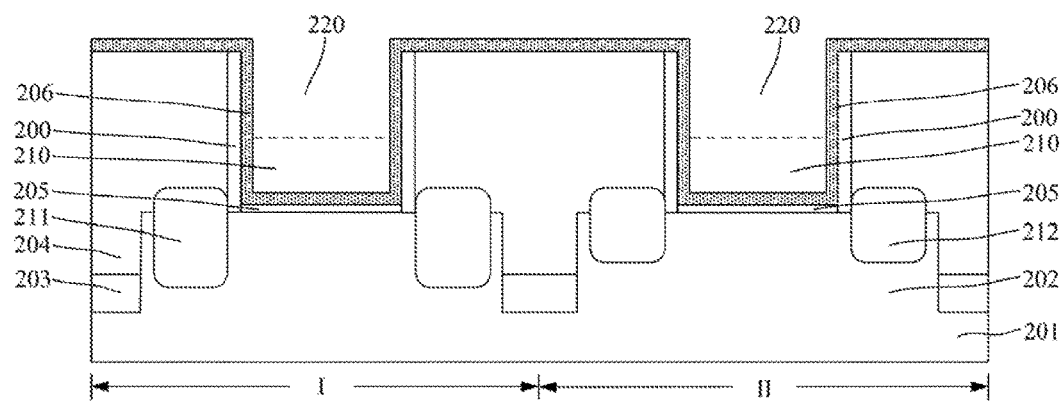

Returning to FIG. 12, after forming the first openings 210 and the second openings 220, a high-K gate dielectric layer may be formed (S102). FIG. 2 illustrates a corresponding semiconductor.

As shown in FIG. 2, a high-K gate dielectric layer 206 is formed on the bottom and side surfaces of the first opening 210 and the side surfaces of the second openings 220. Specifically, the high-K gate dielectric layer 206 may also be formed on the sidewall spacers 200. The high-K gate dielectric layer 206 may also be on the top surface of the interlayer dielectric layer 204. In one embodiment, before forming the high-K gate dielectric layer 206, an interface layer 205 may be formed on the surfaces of the fins 202 on the bottoms of the first openings 210.

The high-K gate dielectric layer 206 may be made of any appropriate high-K dielectric material(s). As used herein, the high-K dielectric material may refer to the dielectric material having a relative dielectric constant greater than the relative dielectric constant of silicon oxide. The high-K dielectric material may include $HfO_2$, HfSiO, HiSiOn, HfTaO, HfTiO, HfZrO, $ZrO_2$, or $Al_2O_3$, etc.

Various processes may be used to form the high-K gate dielectric layer 206, such as a chemical vapor deposition (CVD) process, a physical vapor deposition (PVD) process, or an atomic layer deposition (ALD) process, etc. In one embodiment, the high-K gate dielectric layer 206 is made of fifth. The thickness of the high-K gate dielectric layer 206 may be in a range of approximately 5 Å-15 Å. An ALD process is used to form the high-K gate dielectric layer 206.

The high-K gate dielectric layer 206 may have defects. The defects may include one or more types from oxygen vacancies, dangling bonds and unbonding ions, etc.

Taking the oxygen vacancies defects as an example, because the high-K dielectric material may often be ion crystals, each metal ions may have a plurality of bonds with oxygen ions. When oxygen ions are in deficiency, it may be easy to form oxygen vacancies. The oxygen vacancies may introduce a bandgap status in the center of the bandgap of the high-K dielectric material; and become the defect energy level of the conductive mechanism. If the high-K gate dielectric layer 206 is directly used as a portion of the gate dielectric layer of the gate structures, the dielectric relaxation issue in the semiconductor device may be prominent.

The interface layer 205 may be used to improve the interface property between the high-K gate dielectric layer 206 and the base substrate. In one embodiment, the interface layer 205 may be formed on the top and side surfaces of the fins exposed by the first openings 210.

The interface layer 205 may be made of any appropriate material(s). In one embodiment, the interface layer 205 is made of silicon oxide.

Various processes may be used to form the interface layer 205, such as a thermal oxidation process, or a chemical oxidation process, etc. In one embodiment, the interface layer 205 is formed by a thermal oxidation process.

After forming the high-K gate dielectric layer 206, the high-K gate dielectric layer 206 may be repaired. The repairing process may be able to increase the density of the high-K gate dielectric layer 206. The repairing process may be any appropriate process, such as a rapid thermal annealing process, or a spike thermal annealing process, etc. The temperature of the rapid thermal annealing process may be approximately 750° C.; and the time duration of the rapid thermal annealing process may be in a range of approximately 5 s-10 s. The temperature of the spike thermal annealing process may be approximately 850° C.

Figure 3:
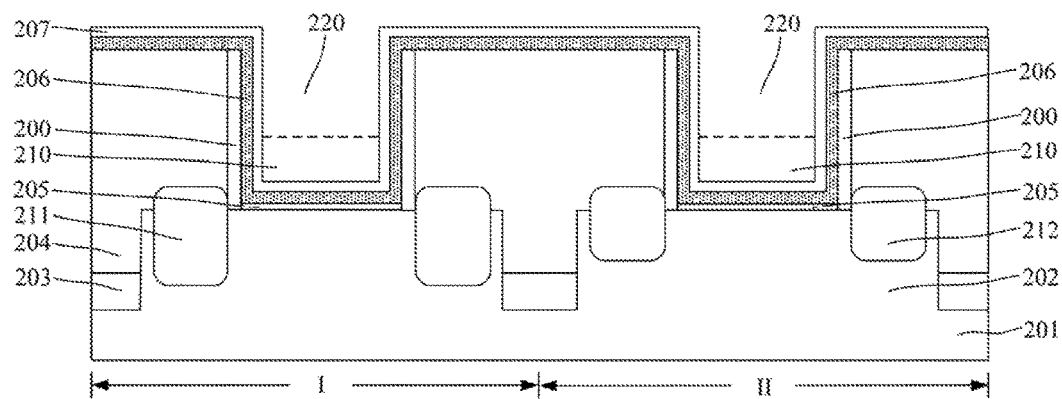

Returning to FIG. 12, after forming the high-K gate dielectric layer 206, a cap layer may be firmed (S103). FIG. 3 illustrates a corresponding semiconductor structure.

As shown in FIG. 3, a cap layer 207 is formed on the high-K gate dielectric layer 206. The cap layer 207 may have oxygen ions.

The cap layer 207 may be able to protect the high-K gate dielectric layer 206; and prevent the subsequent processes from damaging the high-K gate dielectric layer 206. Further, during the subsequent thermal annealing, process, the oxygen ions in the cap layer 207 may diffuse into the high-K gate dielectric layer 206; and the amount of the oxygen vacancies in the high-K gate dielectric layer 207 may be reduced.

The cap layer 207 may be made of any appropriate material(s). In one embodiment, the cap layer 207 is made of oxygen-ion-containing TiN. In some embodiments, the cap layer may be oxygen-ion-containing TaN.

To ensure the amount of the oxygen ions diffusing into the high-K gate dielectric layer 206 during the subsequent thermal annealing process to be enough, the amount of the oxygen ions in the cap layer 207 should not be too small. Further, the amount of the oxygen ions in the cap layer 207 may not be too large, or after the oxygen ions entirely occupy the oxygen vacancies during the subsequent thermal annealing process, the oxygen ions may continue to diffuse into the high-K gate dielectric layer 206 to reach the surfaces of the fins 202; and the surfaces of the fins 202 may be oxidized. Thus, in one embodiment, the mole percentile of the oxygen ions in the cap layer 207 may be in a range of approximately 0.5%-5%.

The thickness of the cap layer 207 may be in a range of approximately 10 Å-60 Å. Various processes may be used to form the cap layer 207, such as a CVD process, a PVD process, or an ALD process, etc.

Figure 4:
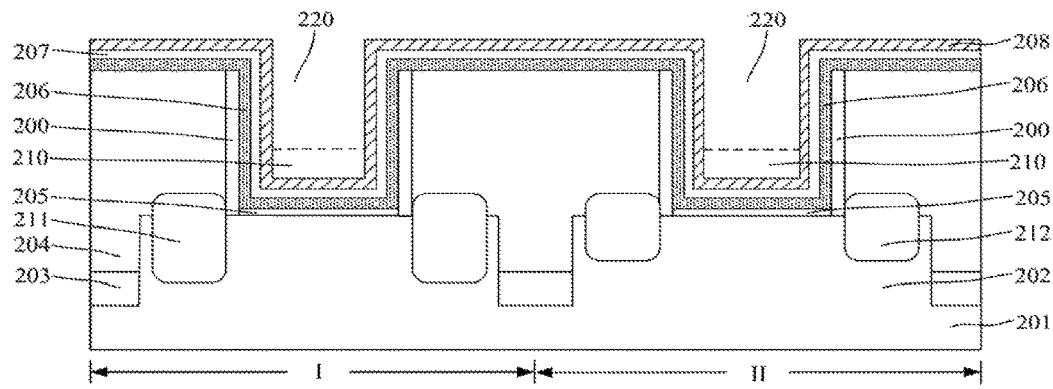

Returning to FIG. 12, after forming the cap layer 207, an amorphous silicon film may be formed (S104). FIG. 4 illustrates a corresponding semiconductor structure.

As shown in FIG. 4, an amorphous silicon film 208 is formed on the cap layer 207 on the side and bottom surfaces of the first openings 210 and the side surfaces of the second openings 220. The amorphous silicon film 208 may provide a process base for subsequently forming an amorphous silicon layer on the cap layer 207 on the bottoms of the first openings 210.

The amorphous silicon film 208 is made of amorphous silicon. The amorphous film 208 may have a relatively large amount of dangling bonds. Accordingly, the subsequently formed amorphous silicon layer may also have a relatively large amount of dangling bonds.

The thickness of the amorphous silicon film 208 may be an appropriate value. If the thickness of the amorphous silicon film 208 is too small, the subsequently formed amorphous silicon layer may be too thin. Accordingly, the ability of the amorphous silicon layer for absorbing the oxygen ions in the cap layer 207 during the subsequent thermal annealing process may be limited. If the thickness of the amorphous silicon film 208 is too large, the subsequently formed amorphous silicon layer may be too thick. Accordingly, the stress applied to the high-K gate dielectric layer 206 by the amorphous silicon layer during the subsequent thermal annealing process may be relatively large; and the high-K gate dielectric layer 206 may be broken. Further, the ability of the amorphous silicon layer for absorbing the oxygen ions in the cap layer 207 during the subsequent thermal annealing process may be too strong. Thus, the amount of the oxygen ions diffusing into the high-K gate dielectric layer 206 may be reduced; and the amount of the oxygen vacancies in the high-K gate dielectric layer 206 after the thermal annealing process may still be relatively large. Thus, in one embodiment, the thickness of the amorphous silicon film 208 may be in a range of approximately 20 Å-80 Å.

Various processes may be used to form the amorphous silicon film 208. In one embodiment, the amorphous silicon film 208 is formed by a CVD process. In some embodiments, the amorphous silicon film may be formed by an ALD process, or a PVD process.

Figure 5:
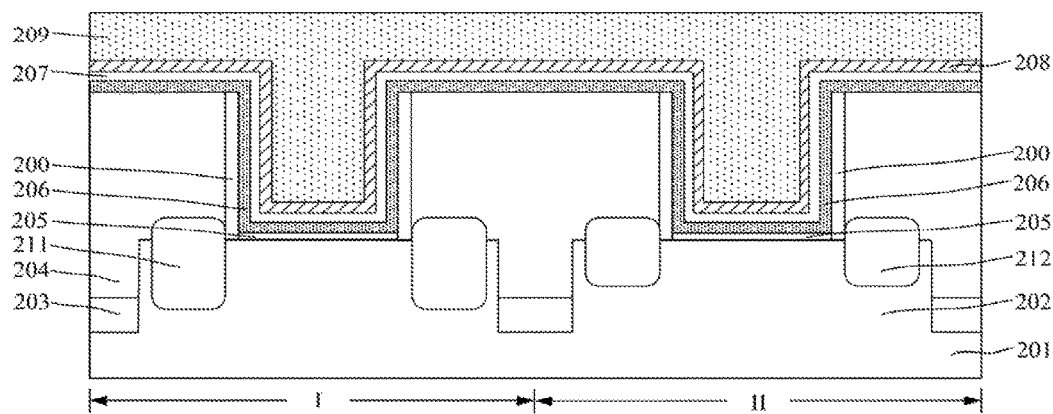

Returning to FIG. 12, after forming the amorphous silicon film 208, a filling film may be formed (S105). FIG. 5 illustrates a corresponding semiconductor structure.

As shown in FIG. 5, a filling film 209 is formed on the amorphous silicon film 208. The filling film 209 may fill the first openings 210 and the second openings 220. The filling film 209 may provide a process base for subsequently forming a filling layer.

The filling film 209 may be made of a material that may be easily removed. Further, the process for subsequently removing the filling layer may not adversely affect the high-K gate dielectric layer 206 and the cap layer 207.

Thus, the filling film 209 may be made of an organic dielectric layer (ODL) material, a bottom anti-reflective coating (BARC) material, or a deep UV light absorbing oxide (DUO) material, etc. For example, the DUO material may be a polysiloxane material, including $CH_3$—$SiO_x$, Si—OH, or $SiOH_3$, etc.

In one embodiment, the filling film 209 is made of an ODL material. The filling film 209 made of the ODL material may be formed by a spin-coating process.

After forming the filling film 209, the top surface of the filling film 209 may be planarized. In one embodiment, the top of the filling film 209 may be higher than the amorphous silicon film 208 above the top of the interlayer dielectric layer 204. In some embodiments, the top of the filling film 209 may level with the amorphous silicon film 208 above the top of the interlayer dielectric layer 204.

Figure 6:
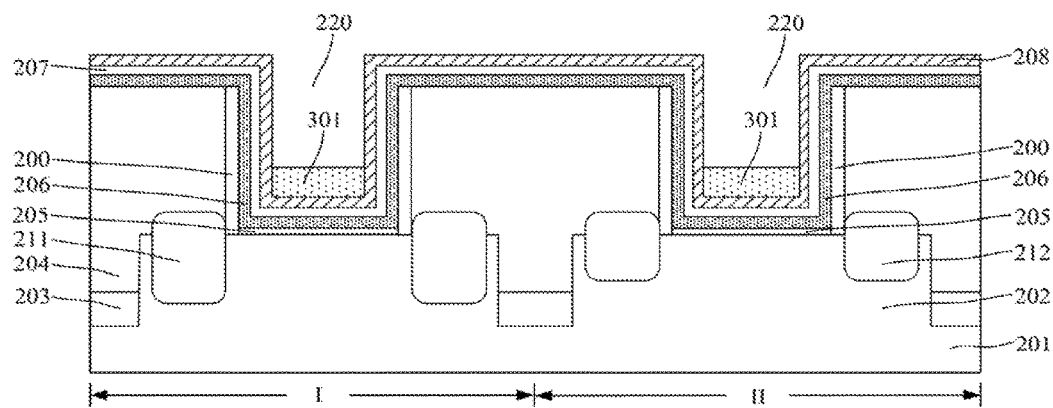

Returning to FIG. 12, after forming the filling film 209, a filling layer may be formed (S106). FIG. 6 illustrates a corresponding semiconductor structure.

As shown in FIG. 6, a filling layer 301 is formed in the first openings 210. The filling layer 301 may be formed by etching back the filling film 209. Specifically, the filling layer 301 may be formed by removing the portions of the filling film 209 in the second openings 220.

Various processes may be used to remove the portions of the filling film 209 in the second openings 220. In one embodiment, a dry etching process may be used to remove the portions of the filling film 209 in the second openings 220. In some embodiments, the portions of the filling film 209 in the second openings 220 may be removed by a wet etching process, or by sequentially performing a dry etching process and a wet etching process.

Figure 7:
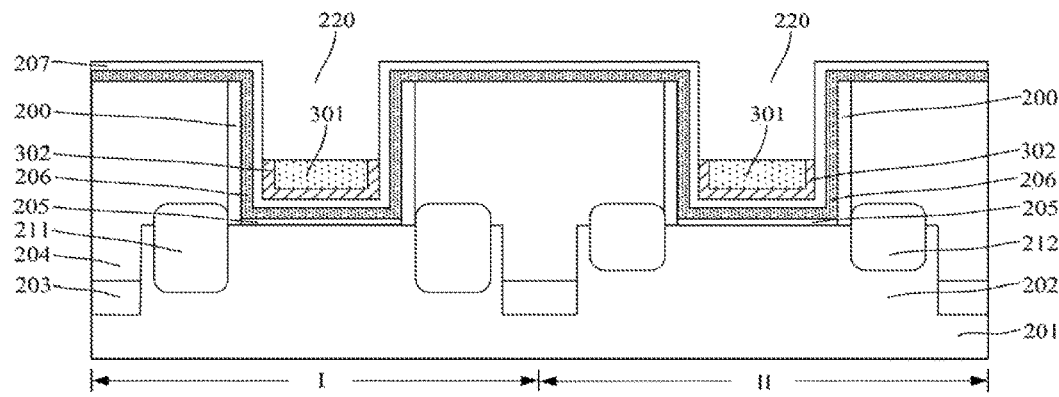

Returning to FIG. 12, after forming the filling layer 301, an amorphous silicon layer may be firmed (S107). FIG. 7 illustrates a corresponding semiconductor structure.

As shown in FIG. 7, an amorphous silicon layer 302 is formed on the cap layer 207 on the side surfaces and the bottoms of the first openings 210. The amorphous silicon layer 302 may expose the cap layer 207 on the side surfaces of the second openings 220.

Specifically, the amorphous silicon layer 302 may be formed by etching the amorphous silicon film 208 on the side surfaces of the second openings 220 using the filling layer 301 as an etching mask. That is, the portions of the amorphous silicon film 208 on the side surfaces of the second openings 220 may be removed; and the amorphous silicon layer 302 may be formed on the high-K gate dielectric layer 206 on the bottoms of the first openings 210.

The portions of the amorphous silicon film 208 on the side surfaces of the second openings 220 may be removed by any appropriate process. In one embodiment, a dry etching process is used to remove the portions of the amorphous silicon film 208 on the side surfaces of the second openings 220.

Referring to FIG. 7, in one embodiment, the amorphous silicon layer 302 may be on the cap layer 207 on the side surfaces of the first openings 210 and the bottoms of the first openings 210. In some embodiments, the amorphous silicon layer may be only on the cap layer on the bottoms of the first openings 210.

According to the descriptions of the amorphous silicon film 208, the amorphous silicon layer 302 is made of amorphous silicon. The thickness of the amorphous silicon layer 302 may be in a range of approximately 20 Å-80 Å.

Figure 8:
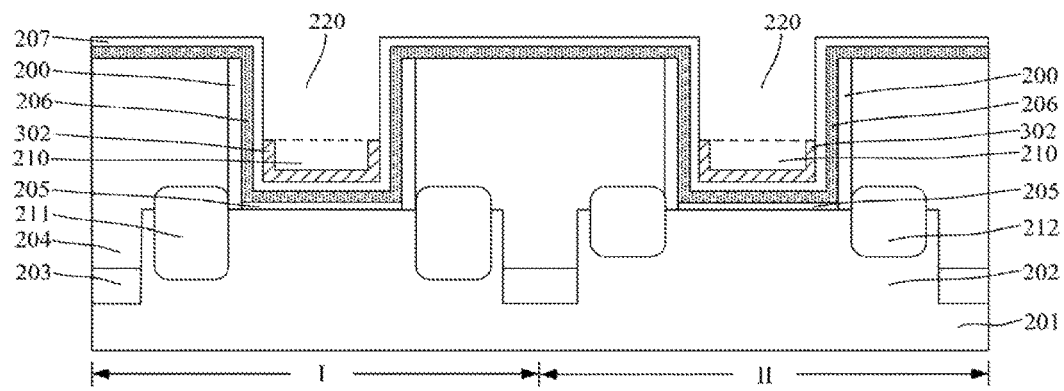

Returning to FIG. 12, after forming the amorphous silicon layer 302, the filling layer 301 may be removed (S108). FIG. 8 illustrates a corresponding semiconductor structure.

As shown in FIG. 8, the filling layer 301 is removed. The filling layer 301 may be removed by any appropriate process. In one embodiment, the filling layer 301 is removed by a plasma ashing process. The gas of the plasma ashing process may include $O_2$. In some embodiments, the filling layer may be removed by a wet photoresist removing process.

In some embodiments, the process for forming the amorphous silicon layer may include forming an amorphous silicon film on the cap layer to fill the first openings and the second openings. Then, an etch-back process may be used to remove the portions of the amorphous silicon film in the second openings; and the portions of the amorphous silicon film in the first openings may be kept; and may be configured as the amorphous silicon layer.

Figure 9:
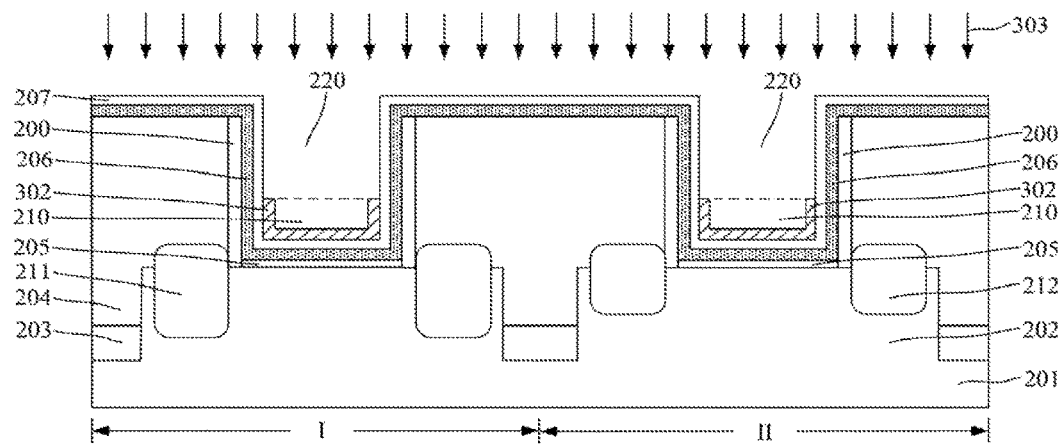

Returning to FIG. 12, after removing the filling layer 301, a thermal annealing process may be performed (S109). FIG. 9 illustrates a corresponding semiconductor structure.

As shown in FIG. 9, a thermal annealing process 303 is performed on the amorphous silicon layer 302, the cap layer 207 and the high-K gate dielectric layer 206. The thermal annealing process 303 may cause the oxygen ions in the cap layer 207 to diffuse into the high-K gate dielectric layer 206. Further, the thermal annealing process 303 may also cause the amorphous silicon layer 302 to absorb the oxygen ions in the cap layer 207.

Because the high-K gate dielectric layer 206 may have oxygen vacancies, during the thermal annealing process 303, the oxygen ions in the cap layer 207 may diffuse into the high-K gate dielectric layer 206, the amount of the oxygen vacancies in the high-K gate dielectric layer 206 may be reduced. Specifically, the oxygen ions diffusing into the high-K gate dielectric layer 206 may occupy the oxygen vacancies. Thus, the amount of the oxygen vacancies in the high-K gate dielectric layer 206 may be reduced. Accordingly, the dielectric relaxation issue in the high-K gate dielectric layer 206 may be improved; and the PBTI and the NBTI issues of the semiconductor structure may be improved.

Further, the thermal annealing process 303 may also be able to passivate the dangling bonds and/or the unbonding ions in the high-K gate dielectric layer 206. Thus, the amount of the dangling bonds and/or the unbonding ions in the high-K gate dielectric layer 206 may be reduced.

Further, the thermal annealing process 303 may be able to passivate the unbonding silicon ions and the unbonding oxygen ions to chemically rearrange the unbonding silicon ions and the unbonding oxygen ions. Thus, the properties of the interface layer 205 may be improved; and the insulation property and the density of the interface layer 205 may be improved.

Further, during the thermal annealing process 303, the amorphous silicon layer 302 may absorb the oxygen ions in the cap layer 207. The dangling bonds in the amorphous silicon layer 302 may have a relatively strong absorption to the oxygen ions. Thus, the amount of the oxygen ions diffusing into the high-K gate dielectric layer 206 may be effectively reduced. Accordingly, it may prevent excessive oxygen ions from diffusing into the base substrate on the bottom of the first openings 210, when there is no oxygen vacancy in the high-K gate dielectric layer 206 to bond with the oxygen ions, to oxidize the base substrate on the bottoms of the first openings 210.

Specifically, if the all the oxygen vacancies in the high-K gate dielectric layer are occupied by the oxygen ions; and there still are oxygen ions diffusing into the high-K gate dielectric layer, the excessive oxygen ions may diffuse into the base substrate on the bottom of the first openings through the high-K gate dielectric layer, the base substrate on the bottom of the first openings may be oxidized. The amorphous silicon layer may be able to absorb a portion of the oxygen ions in the cap layer to prevent the excessive oxygen ions from diffusing into the base substrate.

In one embodiment, the thermal annealing process 303 may sequentially include a first annealing process and a second annealing process. The temperature of the second annealing process may be higher than the temperature of the first annealing process. Using such two thermal annealing processes may further improve of the repairing effect of the defects in the high-K gate dielectric layer 206.

The thermal annealing process 103 may include any appropriate thermal annealing processes. In one embodiment, the first annealing process is a spike thermal annealing process; and the second annealing process may be a laser thermal annealing process or a flash thermal annealing process. The temperature of the first annealing process may be in a range of approximately 800° C.-1000° C. The temperature of the second annealing process may be in a range of approximately 950° C.-1150° C.

In some embodiments, the thermal annealing process may be a single step annealing process. That is, the thermal annealing process may only include one annealing process.

In the high-K gate dielectric layer 206, only the portions of the high-K gate dielectric layer 206 on the bottoms of the first openings 210 may affect the electrical properties of the semiconductor devices. The thermal annealing process 303 may reduce the amount of the defects in the high-K gate dielectric layer 206 on the bottoms of the first openings 210. For example, the oxygen vacancies in the high-K gate dielectric layer 206 on the bottoms of the first openings 210 may be reduced. Thus, the properties of the high-K gate dielectric layer 206 affecting the performance of the semiconductor device may be improved.

At the same time, because the interlayer layer dielectric layer 204 and the sidewall spacers 200 may be close to the sidewalls of the second openings 220, the oxygen ions in the cap layer 207 on the side surfaces of the second openings 220 may diffuse into the interlayer dielectric layer 204 and the sidewall spacers 200. The ions diffusing into the interlayer dielectric layer 204 and the sidewall spacers 200 may have minimal, or not effect to the electrical properties of the semiconductor device.

Further, during the thermal annealing process 303, the internal material structure of the amorphous silicon layer 302 may change; and the internal material structures of the cap layer 207 and the high-K gate dielectric layer 206 may also change. Such material structure changes may cause the amorphous silicon layer 302, the cap layer 207 and the high-K gate dielectric layer 206 to have lattice mismatches; and stresses may be generated. In one embodiment, because the contact area between the cap layer 207 and the amorphous silicon layer 302 may be relatively small, the stress endured by the high-K gate dielectric layer 206 may also be relatively small. Thus, cracks caused by a relatively large stress may be prevented from forming in the high-K gate dielectric layer 206 and the cap layer 207. Accordingly, the high-K gate dielectric layer 206 and the cap layer 207 may have acceptable properties.

In one embodiment, the bottoms of the first openings 210 may expose portions of the top and side surfaces of the fins 202; and the side surfaces of the fins 202 may have some dangling bonds. However, because the oxygen vacancies in the high-K gate dielectric layer 206 may absorb oxygen ions; and the dangling bonds in the amorphous silicon layer 302 may also absorb the oxygen ions, the difficulties for the dangling bonds on the side surfaces of the fins 20'7 far away from the cap layer 207 to absorb the oxygen ions may be increased. Thus, the oxidation of the base substrate on the bottoms of the first openings 210 during the thermal annealing process 303 may be avoided. Accordingly, the thickness increase issue of the interface layer 205 may be avoided.

Returning to FIG. 12, after performing the thermal annealing process, the amorphous silicon layer 302 may be removed (S110). FIG. 10 illustrates a corresponding semiconductor structure.

As shown in FIG. 10, the amorphous silicon layer 302 is removed. The amorphous silicon layer 302 may be removed by any appropriate process. In one embodiment, the amorphous silicon layer 302 is removed by a wet etching process. The etching solution of the wet etching process may include tetramethylammonium hydroxide or ammonia, etc.

To prevent the process for removing the amorphous silicon layer 302 from damaging the high-K gate dielectric layer 206 and the cap layer 207, the temperature of the etching solution of the wet etching process may be set in an appropriate range. In one embodiment, the temperature of the etching solution may be in a range of approximately 25° C.-75° C.

Returning to FIG. 12, after removing the amorphous silicon layer 302, a metal layer may be formed (S111). FIG. 11 illustrates a corresponding semiconductor structure.

As shown in FIG. 11, a metal layer 304 is formed in the first openings 210 and the second openings 220. The metal layer 304 may fill the first openings 210 and the second openings 220.

The metal layer 304 may be made of any appropriate material(s), such as one or more of Al, Cu, W, Ag, Au, Pt, Ni, and Ti, etc. Various processes may be used to form the metal layer 304, such as a CVD process, a PVD process, or an ALD process, etc. In one embodiment, the metal layer 304 is made of W; and the metal layer 304 is formed by a metal organic CVD process.

The process fir firming the metal layer 304 may include forming a metal film in the first openings 210 and the second openings 220 and on the cap layer 207. The metal film may fill the first openings 210 and the second openings 220; and the top of the metal film may be above the top of the interlayer layer dielectric layer 204. Then, the portions of the metal film above the interlayer dielectric layer 204 may be removed; and the portions of the cap layer 206 and the high-K gate dielectric layer 206 above the interlayer dielectric layer 204 may also be removed. The portions of the metal film above the interlayer dielectric layer 204 and the portions of the cap layer 206 and the high-K gate dielectric layer 206 above the interlayer dielectric layer 204 may be removed by a polishing process.

In one embodiment, as shown in FIG. 11, to improve the threshold voltage of the semiconductor device, before forming the metal layer 304, a P-type work function layer 311 may be formed on the cap layer 207 in the PMOS region I; and an N-type work function layer 312 may be formed on the cap layer 207 in the NMOS region II. The work function of the P-type work function material may be in a range of approximately 5.1 eV-5.5 eV. The work function of the N-type work function material may be in a range of approximately 3.9 eV-4.5 eV, such as 4 eV, 4.1 eV, or 4.3 eV, etc.

In one embodiment, the P-type work function layer 311 is made of TiN. In some embodiments, the P-type work function layer may also be made of TaN, TiSiN, or TaSiN, etc.

In one embodiment, the N-type work function layer 312 is made of TIAl. In some embodiments, the N-type work function layer may also be made one or more of TiAlN, TiAlC and AlN, etc.

In the disclosed embodiments, because the oxygen vacancies in the dielectric layer 206 may be reduced, the dielectric relaxation issue of the dielectric layer 206 may be improved. Thus, the dielectric relaxation current of the semiconductor device may be reduced. Therefore, the disclosed methods may be able to improve the PBTI and NBTI of the semiconductor devices; and enhance the electrical properties of the semiconductor devices.

Further, because the contact area between the cap layer 207 and the amorphous silicon layer 302 may be relatively small, the stress applied to the cap layer 207 and the high-K gate dielectric layer 206 by the amorphous silicon layer 302 may be relatively small during the thermal annealing process. Accordingly, the cap layer 207 and the high-K gate dielectric layer 206 may have acceptable morphologies during the thermal annealing process. Thus, cracks may be prevented from forming in the high-K gate dielectric layer 206; and the electrical properties of the semiconductor devices may be improved.

Thus, a semiconductor device may be formed by the disclosed methods and processes. FIG. 11 illustrates a corresponding semiconductor structure.

As shown in FIG. 11, the semiconductor device includes, a base substrate having PMOS region I and an NMOS region II and gate structures formed on the base substrate. The base substrate may include a semiconductor substrate 201 and fins 202 formed on the semiconductor substrate 201. The gate structures may include an interface layer 205 formed on the base substrate; a high-K gate dielectric layer 206 formed on the interface layer 205; a cap layer 207 formed on the high-K gate dielectric layer 206; a P-type work function layer 311 formed on the high-K gate dielectric layer 206 in the PMOS region I; an N-type work function layer 312 formed on the high-K gate dielectric layer 206 in the NMOS region II; and a metal layer 304 formed on the P-type work function layer 311 and the N-type work function layer 312. Further, the semiconductor device may also include an interlayer dielectric layer 204 formed over the base substrate. The interlayer dielectric layer 204 may cover the side surfaces of the gate structures. Further, the semiconductor device may also include source/drain doping regions 211 formed in the base substrate at two sides of the gate structures; and sidewall spacers 200 formed between the gate structures and the interlayer dielectric layer 204. The detailed structures and intermediate structures are described above with respect to the fabrication processes.

Therefore, comparing the existing methods, after forming the oxygen-containing cap layer on the high-K gate dielectric layer, an amorphous silicon layer may be formed on the cap layer on the bottoms of the first openings. Then, a thermal annealing process may be performed on the amorphous silicon layer, the cap layer and the high-K gate dielectric layer. The thermal annealing process may cause the oxygen ions in the cap layer to diffuse into the high-K gate dielectric layer; and also cause the amorphous silicon layer to absorb the oxygen ions in the cap layer. Thus, the defects in the high-K gate dielectric layer on the bottoms of the first openings may be reduced. Accordingly, the DR current of the semiconductor devices may be reduced.

Further, the amorphous silicon layer may absorb the oxygen ions during the thermal annealing process. Thus, the amount of the oxygen ions diffusing into the high-K dielectric layer may be reduced; and the oxygen ions may be prevented from diffusing into the base substrate on the bottoms of the first openings. Thus, the base substrate on the bottoms of the first openings may not be oxidized.

Further, the amorphous silicon layer may expose the cap layer on the side surfaces of the second openings. Thus, the contact area between the amorphous silicon layer and the cap layer may be relatively small. Accordingly, during the thermal annealing process, the stress applied to the cap layer by the amorphous silicon layer may be relatively small. Thus, cracks caused by a relatively large stress may be prevented from forming in the cap layer and/or the high-K gate dielectric layer. Thus, the electrical properties of the semiconductor devices may be desired.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
    forming an interlayer dielectric layer on a base substrate;
    forming a plurality of first openings and second openings in the interlayer dielectric layer, one first opening connecting to one second opening, the one first opening being between the one second opening and the base substrate to expose the base substrate;
    forming a high-K gate dielectric layer on side and bottom surfaces of the first openings and on side surfaces of the second openings;
    forming a cap layer, containing oxygen ions, on the high-K gate dielectric layer;
    forming an amorphous silicon layer on the cap layer and at least on the bottom surfaces of the first openings, wherein forming the amorphous silicon layer comprises:
        forming an amorphous silicon film on the cap layer on the side and bottom surfaces of the first openings and the side surfaces of the second openings;
        forming a filling layer to fill the first openings;
        etching portions of the amorphous silicon film on the side surfaces of the second openings using the filling layer as an etching mask; and
        removing the filling layer;
    after forming the amorphous silicon layer, performing a thermal annealing process on the cap layer and the high-K gate dielectric layer through the amorphous silicon layer to cause the oxygen ions to diffuse into the high-K gate dielectric layer and the amorphous silicon layer to absorb the oxygen ions;
    removing the amorphous silicon layer; and
    forming a metal layer to fill the first openings and the second openings.

2. The method according to claim 1, wherein:
    the high-K gate dielectric layer has defects including oxygen vacancies; and
    the amorphous silicon layer exposes the side surfaces of the second openings.

3. The method according to claim 1, wherein:
    the thermal annealing process includes a first annealing process and a second annealing process; and
    a temperature of the second annealing process is greater than a temperature of the first annealing process.

4. The method according to claim 3, wherein:
    the first annealing process is a spike annealing process; and
    the second annealing process is one of a laser annealing process and a flash annealing process.

5. The method according to claim 3, wherein:
    the temperature of the first annealing process is in a range of approximately 800° C.–1000° C.; and
    the temperature of the second annealing process is in a range of approximately 950° C.–1150° C.

6. The method according to claim 1, wherein:
the amorphous silicon layer is removed by a wet etching process;
an etching solution of the wet etching process includes one of tetramethylammonium hydroxide and ammonia; and
a temperature of the etching solution is in a range of approximately 25° C.-75° C.

7. The method according to claim 1, before forming the high-K gate dielectric layer, further comprising:
forming an interface layer on a surface of the base substrate and on the bottom surface of the first openings.

8. The method according to claim 1, wherein:
a depth of the first openings is smaller than a depth of the second openings.

9. The method according to claim 1, wherein forming the filling layer comprises:
forming a filling film filling the first openings and the second openings on the amorphous silicon film;
etching the filling film to remove portions of the filling film in the second openings.

10. The method according to claim 1, wherein:
the filling layer is made of one of an organic dielectric (ODL) material, a back antireflective (BARC) material and a deep UV light absorbing oxide (DUO) material.

11. The method according to claim 1, after forming the high-K gate dielectric layer and before forming the amorphous silicon layer, further comprising:
repairing the high-K gate dielectric layer.

12. The method according to claim 11, wherein:
the high-K gate dielectric layer is repaired by one of a rapid thermal annealing process and a spike annealing process;
a temperature of the thermal annealing process is approximately 750° C.;
a time duration of the thermal annealing process is in a range of approximately 5 s-10 s; and
a temperature of the spike annealing process is approximately 850° C.

13. The method according to claim 1, wherein:
the base substrate includes a semiconductor substrate and a plurality of fins formed on the semiconductor substrate; and
the first openings expose portions of side and top surfaces of the fins.

14. A method for fabricating a semiconductor device, comprising:
forming an interlayer dielectric layer on a base substrate;
forming a plurality of first openings and second openings in the interlayer dielectric layer, one first opening connecting to one second opening, the one first opening being between the one second opening and the base substrate to expose the base substrate;
forming a high-K gate dielectric layer on side and bottom surfaces of the first openings and on side surfaces of the second openings;
forming a cap layer, containing oxygen ions, on the high-K gate dielectric layer;
forming an amorphous silicon layer on the cap layer and at least on the bottom surfaces of the first openings wherein forming the amorphous silicon layer comprises:
forming an amorphous silicon film filling the first openings and the second openings on the cap layer; and
etching back the amorphous silicon film to remove portions of the amorphous silicon film in the second openings and configuring remaining portions of the amorphous silicon film in the first openings as the amorphous silicon layer;
performing a thermal annealing process on the amorphous silicon layer, the cap layer and the high-K gate dielectric layer to cause the oxygen ions to diffuse into the high-K gate dielectric layer;
removing the amorphous silicon layer; and
forming a metal layer to fill the first openings and the second openings.

15. The method according to claim 14, wherein:
the high-K gate dielectric layer has defects including oxygen vacancies; and
the amorphous silicon layer exposes the side surfaces of the second openings.

16. The method according to claim 14, wherein:
the thermal annealing process includes a first annealing process and a second annealing process; and
a temperature of the second annealing process is greater than a temperature of the first annealing process.

17. The method according to claim 16, wherein:
the first annealing process is a spike annealing process; and
the second annealing process is one of a laser annealing process and a flash annealing process.

18. The method according to claim 16, wherein:
the temperature of the first annealing process is in a range of approximately 800° C.-1000° C.; and
a temperature of the second annealing process is in a range of approximately 950° C.-1150° C.

19. The method according to claim 14, wherein:
the amorphous silicon layer is removed by a wet etching process;
an etching solution of the wet etching process includes one of tetramethylammonium hydroxide and ammonia; and
a temperature of the etching solution is in a range of approximately 25° C.-75° C.

* * * * *